United States Patent
Bowman et al.

(10) Patent No.: US 9,229,054 B2
(45) Date of Patent: Jan. 5, 2016

(54) SELF-CONTAINED, PATH-LEVEL AGING MONITOR APPARATUS AND METHOD

(75) Inventors: Keith A. Bowman, Hillsboro, OR (US); Carlos Tokunaga, Hillsboro, OR (US); James W. Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 13/976,931

(22) PCT Filed: Sep. 28, 2011

(86) PCT No.: PCT/US2011/053790
§ 371 (c)(1),
(2), (4) Date: Jun. 27, 2013

(87) PCT Pub. No.: WO2013/048398
PCT Pub. Date: Apr. 4, 2013

(65) Prior Publication Data
US 2013/0285685 A1    Oct. 31, 2013

(51) Int. Cl.
| | |
|---|---|
| *G01R 31/3187* | (2006.01) |
| *G01R 31/317* | (2006.01) |
| *G01R 31/3193* | (2006.01) |
| *G01R 31/26* | (2014.01) |
| *G01R 31/28* | (2006.01) |
| *G06F 1/10* | (2006.01) |

(52) U.S. Cl.
CPC ...... *G01R 31/31707* (2013.01); *G01R 31/2642* (2013.01); *G01R 31/2882* (2013.01); *G01R 31/31725* (2013.01); *G01R 31/31937* (2013.01); *G06F 1/10* (2013.01)

(58) Field of Classification Search
None
See application file for complete search history.

(56) References Cited

U.S. PATENT DOCUMENTS

| | | | |
|---|---|---|---|
| 7,129,800 B2 | 10/2006 | Gauthier et al. | |
| 7,965,133 B2 * | 6/2011 | Anidjar et al. | 327/544 |
| 2006/0223201 A1 | 10/2006 | Liu et al. | |
| 2007/0075792 A1 | 4/2007 | Liu | |
| 2007/0132523 A1 | 6/2007 | Newman | |
| 2008/0084228 A1 | 4/2008 | Liu et al. | |
| 2009/0319202 A1 | 12/2009 | Gebara et al. | |
| 2010/0019818 A1 * | 1/2010 | Priel et al. | 327/276 |
| 2010/0052730 A1 * | 3/2010 | Grochowski et al. | 327/20 |

(Continued)

OTHER PUBLICATIONS

International Search Report and Written Opinion mailed May 4, 2012 for International Application No. PCT/US2011/053790, 10 pages.

(Continued)

*Primary Examiner* — Minh N Tang
(74) *Attorney, Agent, or Firm* — Schwabe, Williamson & Wyatt, P.C.

(57) ABSTRACT

An aging monitor circuit that provides a more accurate estimate of aging and/or delay in a circuit and/or circuit path. The aging monitor circuit employs a separate aging path with driving and receiving flip flops (FFs) and a tunable replica circuit (TRC) to enable measurements of single-transition DC-stressed path delay that only propagates through stressed transistors or other circuit element(s). A finite state machine (FSM) in the aging monitor circuit is configured to adjust a frequency of a clock signal output by a digitally controlled oscillator (DCO) in response to an error signal output by the receiving FF. The error signal is generated in response to single-transition DC-stressed path delay; and therefore enables the adjustment of the frequency of the dock signal to correspond to an amount or effect of the delay.

17 Claims, 3 Drawing Sheets

(56) References Cited

U.S. PATENT DOCUMENTS

2010/0079184 A1* 4/2010 Bowman et al. .............. 327/225
2010/0194400 A1   8/2010 Baumann et al.
2011/0101990 A1   5/2011 Noorlag et al.
2012/0221884 A1* 8/2012 Carter et al. ...................... 714/2

OTHER PUBLICATIONS

International Preliminary Report on Patentabiity for PCT Application No. PCT/US2011/053790, dated Apr. 10, 2014 (5 pages).

* cited by examiner

Figure 3

SELF-CONTAINED, PATH-LEVEL AGING MONITOR APPARATUS AND METHOD

CROSS REFERENCE TO RELATED APPLICATION

The present application is a national phase entry under 35 U.S.C. §371 of International Application No. PCT/US2011/053790, filed Sep. 28, 2011, entitled "SELF-CONTAINED, PATH-LEVEL AGING MONITOR APPARATUS AND METHOD," which designates, among the various States, the United States of America, and the entire contents and disclosures of which are hereby incorporated by reference in their entireties.

TECHNICAL FIELD

This disclosure relates generally to electronic circuits. More particularly but not exclusively, the present disclosure relates to a circuit to monitor aging that affects circuit delay.

BACKGROUND INFORMATION

As a transistor ages over time and due to regular usage, the physical/electrical characteristics of the materials that make up the transistor may change. The changes in the physical/electrical characteristics of the materials may, for example, cause a switching speed of the transistor to become slower (more delayed) over time.

In current microprocessors, on-die monitors typically use a ring oscillator (RO) design to measure the impact of transistor aging on circuit delay. A feature of an RO design is the simple integration of the RO into existing product design flows because a RO is generally a self-contained circuit (e.g., a clock signal is not required). A problem with an RO design, however, is the severe underestimation of the impact of transistor aging on circuit delay.

With respect to a circuit path in a microprocessor, the worst-case delay degradation from transistor aging occurs when the path ages during a DC state, in which path nodes receive a constant DC voltage to keep specific transistor(s) in the path turned ON (such as a constant logic high level voltage to keep N-type transistors turned ON and/or a constant logic low level voltage to keep P-type transistors turned ON) and hence these transistor(s) are constantly under DC stress that contributes to the aging of the transistor(s). Such DC-stress during the DC state is the expected aging scenario for the vast majority of paths in a microprocessor. In general, increasing the level of DC voltage results in faster aging.

The path delay change due to DC stress depends significantly on the transition of the input signal being provided to the circuit path(s). Consider for example, a circuit path in which multiple pairs of N-type and P-type transistors are coupled in series, such that the first pair of transistors includes a N-type transistor and a P-type transistor, the second pair of transistors include another N-type transistor and another P-type transistor, and so forth. A single-transition input to the circuit path (such as an input binary signal going from logic high to logic low, or vice versa) will turn ON one of the transistors in the pair, while the other transistor in each pair is turned OFF.

The single-transition DC-stressed path delay that only propagates through stressed transistors represents the worst-case path delay degradation. In comparison, the opposite single-transition unstressed path delay that only propagates through non-stressed transistors may actually result in a delay improvement due to the reduced contention between stressed and non-stressed transistors in the path. In a conventional RO design, the RO's delay measurement averages the path delays from both transitions (e.g., stressed and unstressed path delays), thereby significantly underestimating the delay degradation.

Accordingly, even though a conventional RO design allows for simple integration into existing product design flows, the conventional RO design severely underestimates the impact of aging on circuit path delay since the path delays from both stressed and unstressed transitions are averaged. Hence, current on-die RO-based aging monitors are inadequate for measuring the effect of aging on path delays in a microprocessor or other circuitry.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Embodiments of an aging monitor circuit and method are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides an aging monitor circuit and corresponding method that provide a more accurate estimate of aging and/or delay than the traditional ring oscillator (RO) design discussed above. In an embodiment, the aging monitor circuit employs a separate aging path with driving and receiving flip flops (FFs) and a tunable replica circuit (TRC) to enable measurements of single-transition DC-stressed path delay that only propagates through stressed transistors or other circuit element(s). This embodiment of the aging monitor circuit more accurately captures the path delay degradation due to transistor aging, as compared to conventional RO designs that underestimate or otherwise inaccurately estimate the aging/delay since such conventional RO designs factor in or otherwise include the unstressed path delay(s) in their estimation of aging/delay. A finite state machine (FSM) in the aging monitor circuit is configured to adjust a frequency of a clock signal output from a digitally controlled oscillator (DCO) in response to an error signal. The error signal is generated by and output from the receiving FF in response to single-transition DC-stressed path delay, and therefore enables the adjustment of the frequency of the clock signal to correspond to an amount or effect of the delay.

One embodiment provides an apparatus that includes: an aging path configured to generate an output error signal corresponding to a delay; and a finite state machine (FSM) responsive to the output error signal to adjust a clock frequency, the adjusted clock frequency being indicative of aging that causes the delay.

According to one embodiment, the apparatus further includes a digitally controlled oscillator (DCO) coupled to the FSM to receive a selection signal generated by the FSM to adjust the clock frequency, which is a frequency of a clock signal output by the DCO and which is reduced by the adjustment by the FSM in response to the aging.

According to one embodiment of the apparatus, the aging path includes: a driving flip flop (FF) to generate an output signal; a tunable replica circuit (TRC) coupled to the driving FF to receive the output signal and that replicates a circuit being monitored for the aging; and a receiving FF coupled to the driving FF to receive the output signal generated by the driving FF and coupled to the TRC, the receiving FF being configured to generate transitions in the output error signal in response to transitions of the output signal generated by the driving FF that correspond to a DC stress state that causes the aging.

According to one embodiment of the apparatus, the receiving FF is further configured to maintain a previous logic value of the output error signal in response to an unstressed state.

According to one embodiment of the apparatus, the aging is determined only along a DC-stressed path and not along an unstressed path.

One embodiment provides a system that includes the apparatus, with the system further including: a circuit to be monitored for the aging; a counter to receive an output signal representing the adjusted clock frequency, the counter being driven by the received output signal to generate a counter value; and a processor coupled to the counter and configured to determine the aging of the monitored circuit from the counter value generated by the counter.

According to one embodiment of the system, the apparatus is configured as an aging monitor circuit that is located in a test device.

According to one embodiment of the system, the apparatus is configured as an aging monitor circuit to enable adjustment of operational settings of the system in response to the aging that is determined by the aging monitor circuit during lifetime usage of the system.

One embodiment provides a method that includes: setting an aging monitor circuit to a DC-stress mode to enable specific transistors in a tunable replica circuit in the aging monitor circuit to be placed in a DC-stressed state; and setting the aging monitor circuit to a measurement mode to enable determination, for the DC-stressed state, of a delay in the transistors due to aging.

According to one embodiment of the method, setting the aging monitor circuit to the measurement mode includes: toggling a signal according to a clock signal; enabling a receiving flip flop (FF) according to transitions in the toggled signal that correspond to aging of the transistors and disabling the receiving FF according to transitions in the toggled signal that correspond to an unstressed state of the transistors; generating an error signal if the receiving FF is enabled; and adjusting a frequency of a clock signal in response to the generated error signal, wherein an adjustment in the frequency of the clock signal represents the delay in the transistors due to the aging.

According to one embodiment, the method further includes: driving an output signal of the aging monitor circuit with the adjusted clock signal; and counting a number of pulses of the output signal to obtain a counter value; wherein the adjustment in the frequency of the clock signal includes a reduction in the frequency of the clock signal due to the delay; and wherein the reduction in the frequency of the clock signal results in a lowered counter value.

According to one embodiment, the method further includes dynamically adapting an operational setting of a circuit being mimicked by the tunable replica circuit, in response to the measured delay in the transistors due to the aging.

According to one embodiment of the method, in the measurement mode, the determination of the delay excludes delay in the transistors while in an unstressed state.

According to one embodiment, the method further includes tuning the tunable replica circuit to a worst-case delay scenario for a circuit being mimicked by the tunable replica circuit.

One embodiment provides an article of manufacture that includes a non-transitory computer-readable medium having computer-readable instructions stored thereon that are executable by a processor to: generate an input signal to set an aging monitor circuit to a DC-stress mode or to a measurement mode; wherein setting the aging monitor circuit to the DC-stress mode enables specific transistors in a tunable replica circuit in the aging monitor circuit to be placed in a DC-stressed state; and wherein setting the aging monitor circuit to the measurement mode enables determination, for the DC-stressed state, of a delay in the transistors due to aging; and adapt an operational setting of a circuit being mimicked by the tunable replica circuit in response to an output signal, of the aging monitor circuit, indicative of the delay due to the aging.

According to one embodiment of the article of manufacture, the computer-readable medium further includes instructions stored thereon that are executable by the processor to generate a reset signal to start a finite state machine of the aging monitor circuit to an initial state prior to entering the DC-stressed and measurement modes.

According to one embodiment of the article of manufacture, the computer-readable medium further includes instructions stored thereon that are executable by the processor to generate a selection signal to set the tunable replica circuit to a worst-case delay scenario for the circuit being mimicked by the tunable replica circuit.

According to one embodiment of the article of manufacture, the output signal is derived from a clock signal and drives a counter that generates a counter value, and wherein the counter value has a lowered value if the clock signal is reduced in response to the delay due to the aging.

Figure 1:
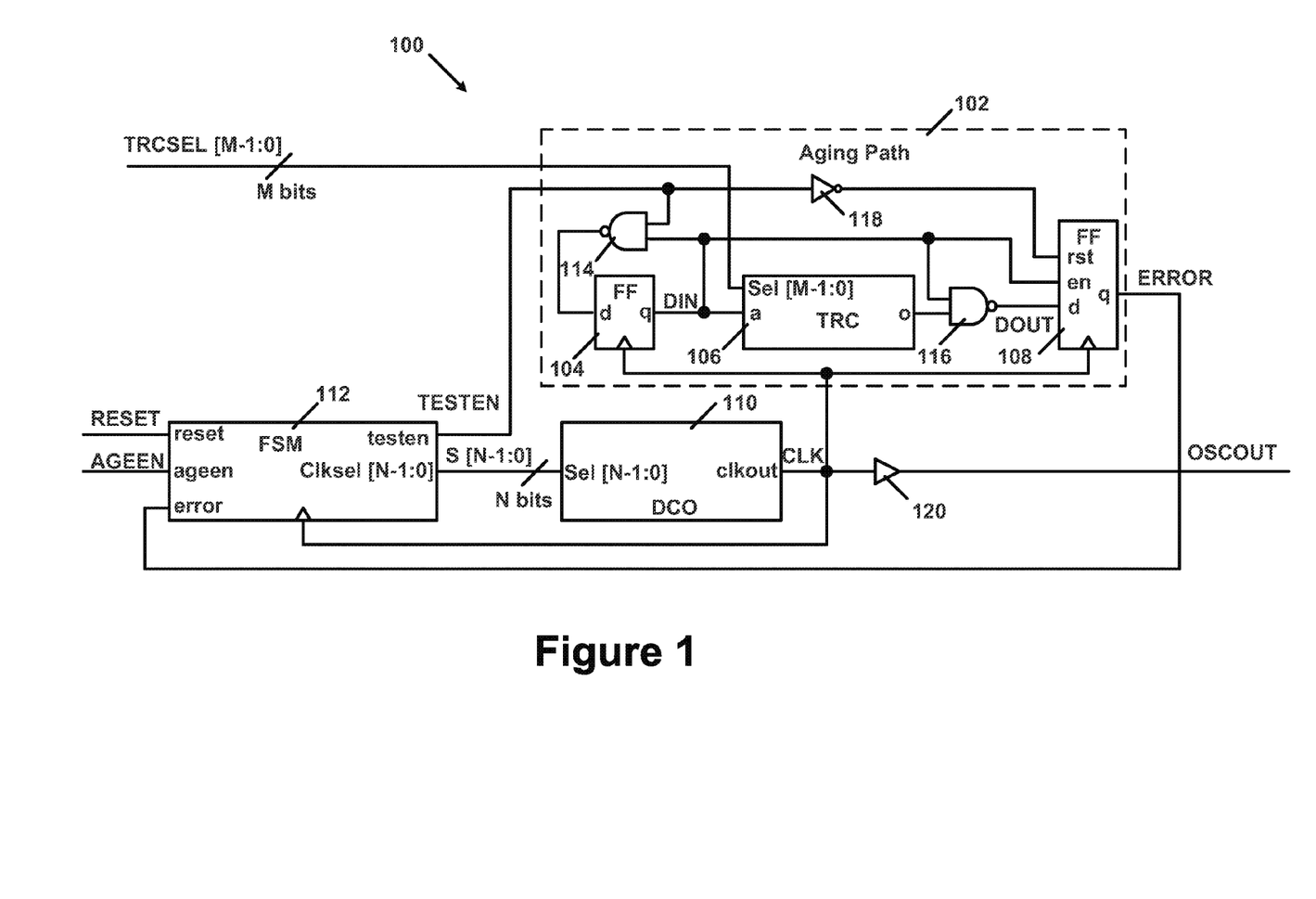
FIG. 1 illustrates an aging monitor circuit in accordance with one embodiment.

FIG. 1 illustrates an aging monitor circuit 100 in accordance with one embodiment. The aging monitor circuit 100 of one embodiment includes an aging path 102. The aging path 102 may in turn include a driving flip-flop (FF) 104, a tunable replica circuit (TRC) 106 coupled to the driving FF 104, and a receiving FF 108 that is coupled to the TRC 106 and that detects timing errors for the single-transition DC-stressed path. The TRC 106 of one embodiment may be a circuit that closely replicates or otherwise mimics the physical structure and/or electronic behavior of the actual circuit (such as a circuit in a microprocessor) that ages over time and through usage. Thus, as the TRC 106 is stressed/aged, such stressing and aging of the TRC 106 will generally be similar to the stressing/aging being encountered by the actual circuit being mimicked. Furthermore in one embodiment, the tuning capability of the TRC 106 enables post-silicon delay tuning to be performed so as to track path delays that may change due to manufacturing variations. In another embodiment, tuning may be performed one or more times over a period of time.

The aging monitor circuit 100 of one embodiment further includes a monotonically programmable digitally controlled oscillator (DCO) 110 and a finite state machine (FSM) 112 coupled to the DCO 110. In one embodiment, the input and output signals for the aging monitor circuit 100 may be identical or similar to the input/output signals in an RO design, thereby enabling simple integration into existing product design flows that would have otherwise used an RO design. These input signals may include a reset input signal RESET, an age enable input signal AGEEN, a tunable replica circuit selection input signal TRCSEL, and an oscillator output signal OSCOUT.

In further detail, the input signal RESET is provided into an input terminal "reset" of the FSM 112, and the input signal AGEEN is provided into an input terminal "ageen" of the FSM 112. The FSM 112 further outputs a test enable output signal TESTEN from an output terminal "testen," and a selection output signal S from an output terminal "Clksel."

The output signal TESTEN is provided to a first input terminal of a first NAND gate 114. An output terminal of the NAND gate is coupled to an input terminal "d" of the driving FF 104. A second input terminal of the NAND gate 114 is coupled to an output terminal "q" of the driving FF 104, so as to receive an input signal DIN that is provided by the driving FF 104 via its output terminal q.

The output terminal q of the driving FF 104 is further coupled to a first input terminal "a" of the TRC 106, so as to receive the input signal DIN from the driving FF 104. A second input terminal "Sel" of the TRC 106 receives the input signal TRCSEL, and an output terminal "o" of the TRC 106 is coupled to a first input terminal of a second NAND gate 116. In one embodiment, the signal TRCSEL is provided via M bit lines to the input terminal Sel of the TRC 106, such that the input signal TRCSEL may be in the form of scan inputs TRCSEL [M-1:0] representing M bits for programming a delay in the TRC 106 at test time to track worst-case-scenario path delays. By programming the TRC 106 for the worst-case-scenario path delay(s), for example, the aging monitor circuit 100 can thus be configured to monitor for the condition if/when the worst-case-scenario occurs in the actual circuit(s) being mimicked/replicated by the TRC 106.

A second input terminal of the NAND gate 116 is coupled to the output terminal q of the driving FF 104 so as to receive the input signal DIN. The receiving FF 108 includes an input terminal "d" coupled to an output terminal of the NAND gate 116 to receive an output signal DOUT. The receiving FF 108 further includes an enable input terminal "en" coupled to the output terminal q of the driving FF 104 so as to receive the input signal DIN, and a reset input terminal "rst" coupled to the output terminal testen of the FSM 112 (via an inverter 118) to receive an inverted version of the output signal TESTEN. An output terminal "q" of the receiving FF 105 is coupled to an input terminal "error" of the FSM 112, so as to provide an output signal ERROR to the input terminal error.

The DCO 110 has an output terminal "clkout" coupled to clock input terminals of the driving FF 104, the receiving FF 108, and the FSM 112, so as to provide an output clock signal CLK thereto. The clock output signal CLK is further provided to an input terminal of a buffer 120, which in turn has an output terminal to provide the output signal OSCOUT. As such, the output signal OSCOUT is thus derived from and driven by the output clock signal CLK (of the DCO 110), which is also the clock signal for the aging path 102.

In one embodiment, the aging monitor circuit 100 may be located on a same integrated circuit (IC) chip as the circuit(s) being monitored. In other embodiments, the aging monitor circuit 100 may be located on a different chip or chip set on some other circuit board from where the circuit(s) being monitored is located. Still further in one embodiment, the aging monitor circuit 100 may be located at a test device (such as may be used during a manufacturing process) to test/estimate the aging of circuit(s) contained in an electronic product that will be provided to consumers/users. In still other embodiments, the aging monitor circuit 100 may be physically present in the electronic product itself that will be provided to consumers/users, such that the aging monitor circuit 100 may be used during the normal operation and lifetime of the electronic product. As such, the information provided by the aging monitor circuit 100 may be used to dynamically adjust operational features/settings of the circuit(s) being monitored and/or the operational features/settings of the electronic product that embodies the circuit(s) being monitored in view of the effects of aging that has been ascertained from the output signal OSCOUT of the aging monitor circuit 100.

Figure 2:
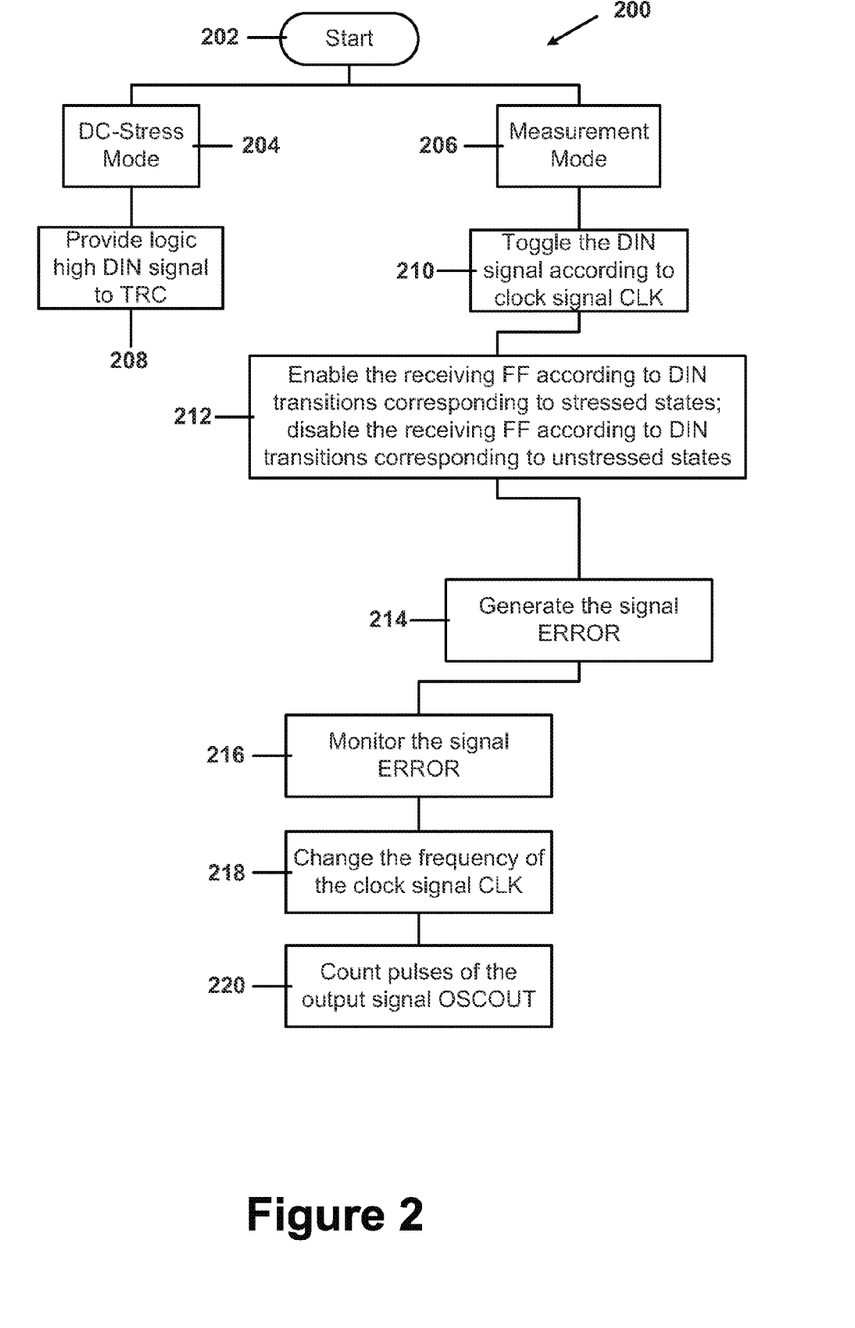
FIG. 2 illustrates a flowchart to operate the aging monitor circuit of FIG. 1 in accordance with one embodiment.

FIG. 2 is a flowchart of a method 200 to operate the aging monitor circuit 100 in accordance with various embodiments. The operations shown in the flowchart need not necessarily occur in the exact order shown. Moreover, certain operations can be added, removed, modified, combined, etc. in various embodiments. In one embodiment, some of the operations shown in the flowchart can be performed by or caused to be performed by software or other computer-readable instruction stored on a tangible computer-readable medium and executable by a processor. For example, one embodiment may include a controller or other processor that can execute software or firmware to generate the input signals TRCSEL, RESET, and AGEEN provided to the aging monitor circuit 100 and/or to interpret the output signal OSCOUT provided by the aging monitor circuit 100.

In operation according to one embodiment, the input signal RESET starts the FSM 112 at a known initial state at a block 202. The input signal AGEEN informs the FSM 112 to either enable a DC-stress mode at a block 204 or a measurement mode at a block 206. In the DC-stress mode, a logic high value (of the input signal DIN) is provided to the TRC 106 at a block 208 so as to place the circuit(s) and/or circuit path(s) therein in a DC-stressed state, such as by turning ON specific transistor(s) in such circuit(s) and/or circuit path(s). In the measurement mode, the delay in such circuit(s) and/or circuit path(s) in the TRC 106 is measured or otherwise determined. During both modes of operation (e.g., the DC-stress or measurement modes), the DCO 110 generates the output clock signal CLK for the aging path 102.

If the aging monitor circuit 100 is in the DC-stress mode, the output signal TESTEN may have a logic low value, thereby resulting in a logic high value for the signal DIN provided by the output terminal q of the driving FF 104. The signal DIN is in turn provided at the block 208 to the input terminal of the TRC 106, thereby ensuring a DC-stress condition for the circuit(s) and/or circuit path(s) in the TRC 106.

If the aging monitor 100 is in the measurement mode at the block 206, the output signal TESTEN may have a logic high value, thereby allowing the signal DIN to toggle at a block 210 at every cycle of the clock signal CLK provided to the driving FF 104. Since the signal DIN is provided to the enable input terminal en of the receiving FF 108 at a block 212, only the path delay corresponding to a logic low-to-logic high transition of the signal DIN is measured by or otherwise detected by the receiving FF 108. Since the logic low-to-logic high transition (corresponding to stressed states) propagates through stressed transistors, the receiving FF 108 is thus configured to capture the DC-stressed path-delay degradation due to transistor aging.

The output signal ERROR is generated by the receiving FF at a block 214. In one embodiment, if the path delay is less than one cycle of the clock signal CLK, then the output signal ERROR of the receiving FF 108 may be a logic low value. Otherwise if the path delay is greater than one cycle of the clock signal CLK, the output signal ERROR becomes a logic high value. Thus, the receiving FF 108 of one embodiment behaves as an error-detection sequential circuit for logic low-to-logic high transitions of the DIN signal.

For logic high-to-logic low transitions of the DIN signal (corresponding to an unstressed state), the receiving FF 108 is disabled at the block 212. Thus, the unstressed path delay is not measured by the receiving FF 108, and the output signal ERROR maintains a previous logic value.

In one embodiment during the measurement mode, the FSM 112 may dynamically calibrate the DCO 110 via the selection output signal S, which in one embodiment is provided as selection signals S [N-1:0] on N bit lines into the DCO 110. The selection signals S [N-1:0] are provided by the FSM 112 to maximize or otherwise adapt the clock frequency (of the clock signal CLK that is output by the DCO 110) to the aging path 102, in response to and by monitoring the signal ERROR by the FSM 112 at a block 216. For instance, if the path delay is greater than one cycle of the current clock signal CLK (thereby indicating a substantial level of path delay), the signal ERROR output from the receiving FF 108 has a logic high value. The logic high value of the ERROR signal causes the FSM 112 to output the selection signals S [N-1:0] to lower or otherwise change the current maximum frequency of the clock signal CLK (i.e., increase the period of the clock signal CLK) at a block 218. The FSM 112 may continuously evaluate the ERROR signal at the block 216 throughout the entire measurement mode.

The clock signal CLK output by the DCO 110 drives the output signal OSCOUT, which in turn drives a counter. In one embodiment, the number of pulses in the output signal OSCOUT is measured/counted by the counter at a block 220 for a target sample time, for example 20 microseconds. The counter value of one embodiment may correspond to current maximum frequency of the clock signal CLK of the DCO 110 for a given scan setting of the TRC 106. As the circuit(s) and/or circuit path(s) age due to DC stress, the path delay increases, thereby resulting in a lower maximum frequency of the clock signal CLK (and correspondingly a reduced number of pulses of the output signal OSCOUT). Consequently, a reduction in the counter's value results.

Thus, the aging monitor circuit 100 of one embodiment is configured to more properly measure or otherwise facilitate the determination of the impact of transistor aging based on the degradation in maximum frequency of the CLK signal for the path, by measuring the single-transition DC-stressed path delay. The aging monitor circuit 100 of one embodiment may further be self-contained in that the aging monitor circuit 100 may be conveniently integrated in or used in a circuit or system where a traditional RO design may have been otherwise used. For example, the aging monitor circuit 100 may use the similar or identical input/output (I/O) interfaces that RO designs would have used.

Embodiments of the aging monitor circuit 100 described herein may be used in a number of implementations and applications. For example, mobile devices, including but not limited to smart phones, nettops, tablets and other Mobile Internet Devices (MIDs) may have circuit(s) that suffer delay due to aging. In such implementations, the aging monitor circuit 100 may be used at a validation/testing stage during a manufacturing process prior to product release and/or may be physically present in the devices such that operational settings of the devices may be dynamically adapted during the lifetime of the devices as the effect of aging is detected by the aging monitor circuit 100

Figure 3:
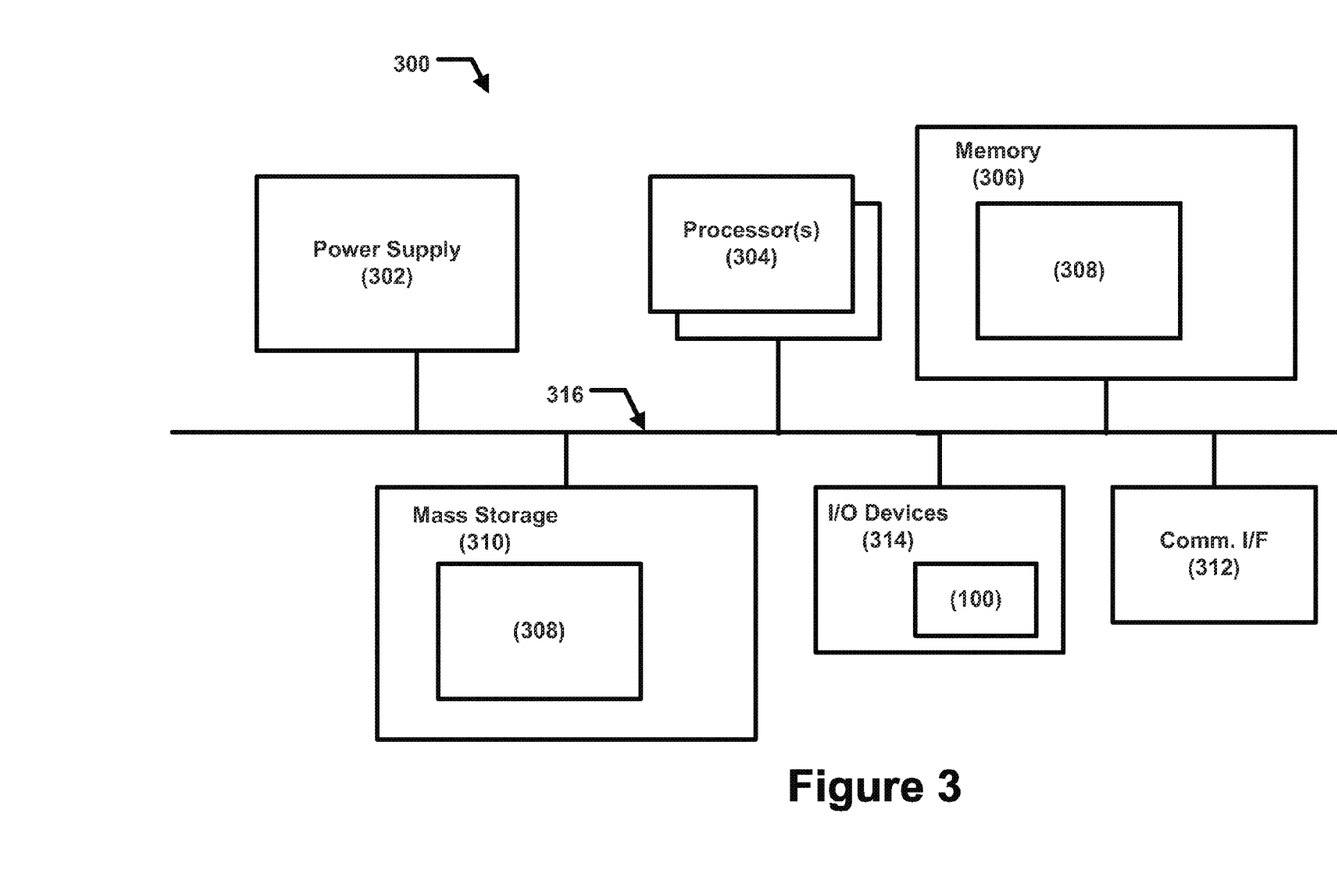
FIG. 3 is a block diagram that illustrates an example computer system suitable to practice the disclosed aging monitor circuit and method of various embodiments.

FIG. 3 is a block diagram that illustrates an example computer system 300 suitable to practice the disclosed aging monitor circuit/method of various embodiments.

As shown, the computer system 300 may include a power supply unit 302, a number of processors or processor cores 304, a system memory 306 having processor-readable and processor-executable instructions 308 stored therein, a mass storage device 310 that may also store the instructions 308, and a communication interface 312. For the purpose of this application, including the claims, the terms "processor" and "processor cores" may be considered synonymous, unless the context clearly requires otherwise.

In various embodiments of the present disclosure, at least one of the processors 304, including a controller, may generate or cause to be generated the input signals provided to the aging monitor circuit 100. Also in various embodiments, one of the processors 304 may be coupled to or include the counter that receives the OSCOUT signal, thereby enabling such processor 304 to analyze the output of the counter (the counter value) to determine the aging and delay.

The one or more mass storage devices 310 and/or the memory 306 may comprise a tangible, non-transitory computer-readable storage device (such as a diskette, hard drive, compact disc read only memory (CDROM), hardware storage unit, and so forth). The instructions 308 stored in the mass storage devices 310 and/or the memory 306 may be executable by one or more of the processors 304 to perform or cause to be performed the operations depicted in the method 200 of FIG. 2, for example.

The computer system 300 may also comprise input/output devices 314 (such as a keyboard, display screen, cursor control, and so forth). In various embodiments and purely by way of example, the I/O devices 314 may themselves include the aging monitor circuit 100, such as shown by way of example in FIG. 3. The aging monitor circuit 100 may alternatively or additionally be located elsewhere in the computer system 300, and may comprise part or all of an integrated circuit.

The various elements of FIG. 3 may be coupled to each other via a system bus 316, which represents one or more buses. In the case of multiple buses, they may be bridged by one or more bus bridges (not shown). Data may pass through the system bus 316 through the I/O devices 314, for example, between the aging monitor circuit 100 and the processors 304.

The system memory 306 and the mass storage device 310 may be employed to store a working copy and a permanent copy of the programming instructions implementing one or more operating systems, firmware modules or drivers, applications, and so forth, herein collectively denoted as 308. The permanent copy of the programming instructions may be placed into permanent storage in the factory, or in the field, through, for example, a distribution medium (not shown), such as a compact disc (CD), or through the communication interface 312 (from a distribution server (not shown)).

According to various embodiments, one or more of the depicted components of the system 300 and/or other element(s) may include a keyboard, LCD screen, non-volatile memory port, multiple antennas, graphics processor, application processor, speakers, or other associated mobile device elements, including a camera.

The remaining constitution of the various elements of the computer system 300 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, P-type and N-type transistors, specific types of logic gates and/or logic configurations, and so forth. In other embodiments, different configurations can be provided in view of whether N-type transistors are used instead of P-type transistors, whether or not certain signals are inverted, whether certain changes in state are triggered in response to falling edges instead of rising edges or vice versa, different logic gate configurations, and so forth.

These and other modifications can be made in light of the above detailed description. The terms used in the following claims should not be construed to be limited to the specific embodiments disclosed in the specification.

What is claimed is:

1. An apparatus, comprising:
   an aging path configured to generate an output error signal corresponding to a delay; and
   a finite state machine (FSM) responsive to the output error signal to adjust a clock frequency, the adjusted clock frequency being indicative of aging that causes the delay;
   wherein the aging path includes:
      a driving flip flop (FF) to generate an output signal;
      a tunable replica circuit (TRC) coupled to the driving FF to receive the output signal and that replicates a circuit to be monitored for the aging; and
      a receiving FF coupled to the driving FF to receive the output signal generated by the driving FF and coupled to the TRC, the receiving FF being configured to generate transitions in the output error signal in response to transitions of the output signal generated by the driving FF that correspond to a DC stress state that causes the aging.

2. The apparatus of claim 1, further comprising a digitally controlled oscillator (DCO) coupled to the FSM to receive a selection signal generated by the FSM to adjust the clock frequency, which is a frequency of a clock signal output by the DCO and which is reduced by the adjustment by the FSM in response to the aging.

3. The apparatus of claim 1 wherein the receiving FF is further configured to maintain a previous logic value of the output error signal in response to an unstressed state.

4. The apparatus of claim 1 wherein the aging is determined only along a DC-stressed path and not along an unstressed path.

5. A system, comprising the apparatus of claim 1, the system further comprising:
   the circuit to be monitored for the aging;
   a counter to receive an adjusted clock signal representing the adjusted clock frequency, the counter being driven by the received adjusted clock signal to generate a counter value; and
   a processor coupled to the counter and configured to determine the aging of the monitored circuit from the counter value generated by the counter.

6. The system of claim 5 wherein the apparatus is configured as an aging monitor circuit that is located in a test device.

7. The system of claim 5 wherein the apparatus is configured as an aging monitor circuit to enable adjustment of operational settings of the system in response to the aging that is determined by the aging monitor circuit during lifetime usage of the system.

8. A method, comprising:
   setting an aging monitor circuit to a DC-stress mode to enable specific transistors in a tunable replica circuit in the aging monitor circuit to be placed in a DC-stressed state; and
   setting the aging monitor circuit to a measurement mode to enable determination, for the DC-stressed state, of a delay in the transistors due to aging.

9. The method of claim 8 wherein said setting the aging monitor circuit to the measurement mode includes:
   toggling a signal according to a clock signal;
   enabling a receiving flip flop (FF) according to transitions in the toggled signal that correspond to aging of the transistors and disabling the receiving FF according to transitions in the toggled signal that correspond to an unstressed state of the transistors;
   generating an error signal if the receiving FF is enabled; and
   adjusting a frequency of an adjusted clock signal in response to the generated error signal, wherein an adjustment in the frequency of the adjusted clock signal represents the delay in the transistors due to the aging.

10. The method of claim 9, further comprising:
    driving an output signal of the aging monitor circuit with the adjusted clock signal; and
    counting a number of pulses of the output signal to obtain a counter value;
    wherein the adjustment in the frequency of the adjusted clock signal includes a reduction in the frequency of the adjusted clock signal due to the delay; and
    wherein the reduction in the frequency of the adjusted clock signal results in a lowered counter value.

11. The method of claim 8, further comprising dynamically adapting an operational setting of a circuit being mimicked by the tunable replica circuit, in response to the measured delay in the transistors due to the aging.

12. The method of claim 8 wherein in the measurement mode, the determination of the delay excludes delay in the transistors while in an unstressed state.

13. The method of claim 8, further comprising tuning the tunable replica circuit to a worst-case delay scenario for a circuit being mimicked by the tunable replica circuit.

14. An article of manufacture, comprising:
    a non-transitory computer-readable medium having computer-readable instructions stored thereon that are executable by a processor to:
    generate an input signal to set an aging monitor circuit to a DC-stress mode or to a measurement mode;
       wherein setting the aging monitor circuit to the DC-stress mode enables specific transistors in a tunable replica circuit in the aging monitor circuit to be placed in a DC-stressed state; and
       wherein setting the aging monitor circuit to the measurement mode enables determination, for the DC-stressed state, of a delay in the transistors due to aging; and
    adapt an operational setting of a circuit being mimicked by the tunable replica circuit in response to an output signal, of the aging monitor circuit, indicative of the delay due to the aging.

15. The article of manufacture of claim 14 wherein the computer-readable medium further includes instructions stored thereon that are executable by the processor to generate a reset signal to start a finite state machine of the aging monitor circuit to an initial state prior to entering the DC-stressed and measurement modes.

16. The article of manufacture of claim 14 wherein the computer-readable medium further includes instructions stored thereon that are executable by the processor to generate a selection signal to set the tunable replica circuit to a worst-case delay scenario for the circuit being mimicked by the tunable replica circuit.

17. The article of manufacture of claim 14 wherein the output signal is derived from a clock signal and drives a counter that generates a counter value, and wherein the counter value has a lowered value if the clock signal is reduced in response to the delay due to the aging.

* * * * *